(12) United States Patent
Mathai et al.

(10) Patent No.: US 10,897,122 B2
(45) Date of Patent: Jan. 19, 2021

(54) OPTICAL APPARATUS FOR OPTICAL TRANSCEIVERS

(71) Applicant: HEWLETT PACKARD ENTERPRISE DEVELOPMENT LP, Palo Alto, CA (US)

(72) Inventors: Sagi Varghese Mathai, Sunnyvale, CA (US); Michael Renee Ty Tan, Menlo Park, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 15 days.

(21) Appl. No.: 15/958,029

(22) Filed: Apr. 20, 2018

(65) Prior Publication Data
US 2019/0326731 A1    Oct. 24, 2019

(51) Int. Cl.
| H01S 5/42 | (2006.01) |
| H01S 5/02 | (2006.01) |
| H01S 5/022 | (2006.01) |
| H01S 5/028 | (2006.01) |
| H01S 5/183 | (2006.01) |

(Continued)

(52) U.S. Cl.
CPC .............. *H01S 5/423* (2013.01); *H01S 5/021* (2013.01); *H01S 5/028* (2013.01); *H01S 5/0217* (2013.01); *H01S 5/0224* (2013.01); *H01S 5/02252* (2013.01); *H01S 5/02288* (2013.01); *H01S 5/18305* (2013.01); *H04B 10/40* (2013.01); *H01S 5/02272* (2013.01); *H01S 5/187* (2013.01)

(58) Field of Classification Search
CPC ...... H01S 5/423; H01S 5/028; H01S 5/18305; H01S 5/021; H01S 5/0224; H01S 5/02288; H01S 5/02252; H01S 5/0217; H01S 5/187; H01S 5/02272; H04B 10/40
See application file for complete search history.

(56) References Cited

U.S. PATENT DOCUMENTS 5,835,517 A * 11/1998 Jayaraman ......... G02B 6/29358
                                                    372/50.124
5,914,976 A    6/1999 Jayaraman et al.
(Continued)

FOREIGN PATENT DOCUMENTS

WO    WO-2000062384    10/2000

OTHER PUBLICATIONS

Choquette, K.D. et al.; "Short-wavelength bottom-emitting VCSELs"; Apr. 29, 1999; 3 pages.

*Primary Examiner* — Yuanda Zhang
(74) *Attorney, Agent, or Firm* — Hewlett Packard Enterprise Patent Department

(57) ABSTRACT

An optical apparatus is provided for an optical transceiver. The optical apparatus includes an interposer, a glass lens chip bonded to the interposer, and a plurality of bottom-emitting vertical-cavity surface-emitting lasers (VCSELs) flip chipped to the interposer. Each of the bottom-emitting VCSELs is fabricated on a respective substrate, at least one bottom-emitting VCSEL is capable of emitting an optical signal having a wavelength of about 850 nm, and at least a portion of the respective substrate on which the at least one bottom-emitting VCSEL is fabricated is removed to permit the at least one bottom-emitting VCSEL to emit the optical signal having the wavelength of about 850 nm to the glass lens chip.

15 Claims, 5 Drawing Sheets

(51) Int. Cl.
*H04B 10/40* (2013.01)
*H01S 5/187* (2006.01)

(56) References Cited

U.S. PATENT DOCUMENTS

| | | | | |
|---|---|---|---|---|
| 6,198,864 B1* | 3/2001 | Lemoff | .............. | G02B 6/29367 |
| | | | | 385/24 |
| 6,372,533 B2 | 4/2002 | Jayaraman et al. | | |
| 6,647,050 B2 | 11/2003 | Yuen et al. | | |
| 7,851,811 B2* | 12/2010 | Dutta | ................ | G02B 6/12002 |
| | | | | 257/84 |
| 9,772,449 B2* | 9/2017 | Sugama | ............ | G02B 6/29367 |
| 9,798,087 B1* | 10/2017 | Mathai | ............... | G02B 6/29367 |
| 10,120,149 B1* | 11/2018 | Mathai | ................... | G02B 6/425 |
| 2011/0044369 A1* | 2/2011 | Andry | ................. | G02B 6/4204 |
| | | | | 372/50.124 |
| 2012/0248977 A1* | 10/2012 | Ootorii | ................ | H01L 25/167 |
| | | | | 313/524 |
| 2013/0223466 A1* | 8/2013 | Gronenborn | ....... | G02B 19/0057 |
| | | | | 372/50.124 |
| 2014/0192832 A1* | 7/2014 | Shih | ........................ | H01L 25/00 |
| | | | | 372/44.01 |
| 2016/0195677 A1* | 7/2016 | Panotopoulos | ...... | G02B 6/4214 |
| | | | | 250/227.23 |
| 2017/0063040 A1* | 3/2017 | Su | ....................... | H01S 5/02469 |

* cited by examiner

OPTICAL APPARATUS FOR OPTICAL TRANSCEIVERS

BACKGROUND

Optical modules, such as optical transceivers, may be used in data centers or network systems to transmit and receive optical signals to and from optical networks and enable electrical network components to interface with and communicate over the optical networks. Wavelength-division multiplexing (WDM) may be used in the optical transceivers to increase communication bandwidth by sending multiple optical signals operating at different wavelengths down a single waveguide, such as an optical fiber. A multiplexer is used to join the optical signals together before transmission, and a demultiplexer is used to separate a received optical signal into constituent optical signals.

BRIEF DESCRIPTION OF THE DRAWINGS

The present disclosure is best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
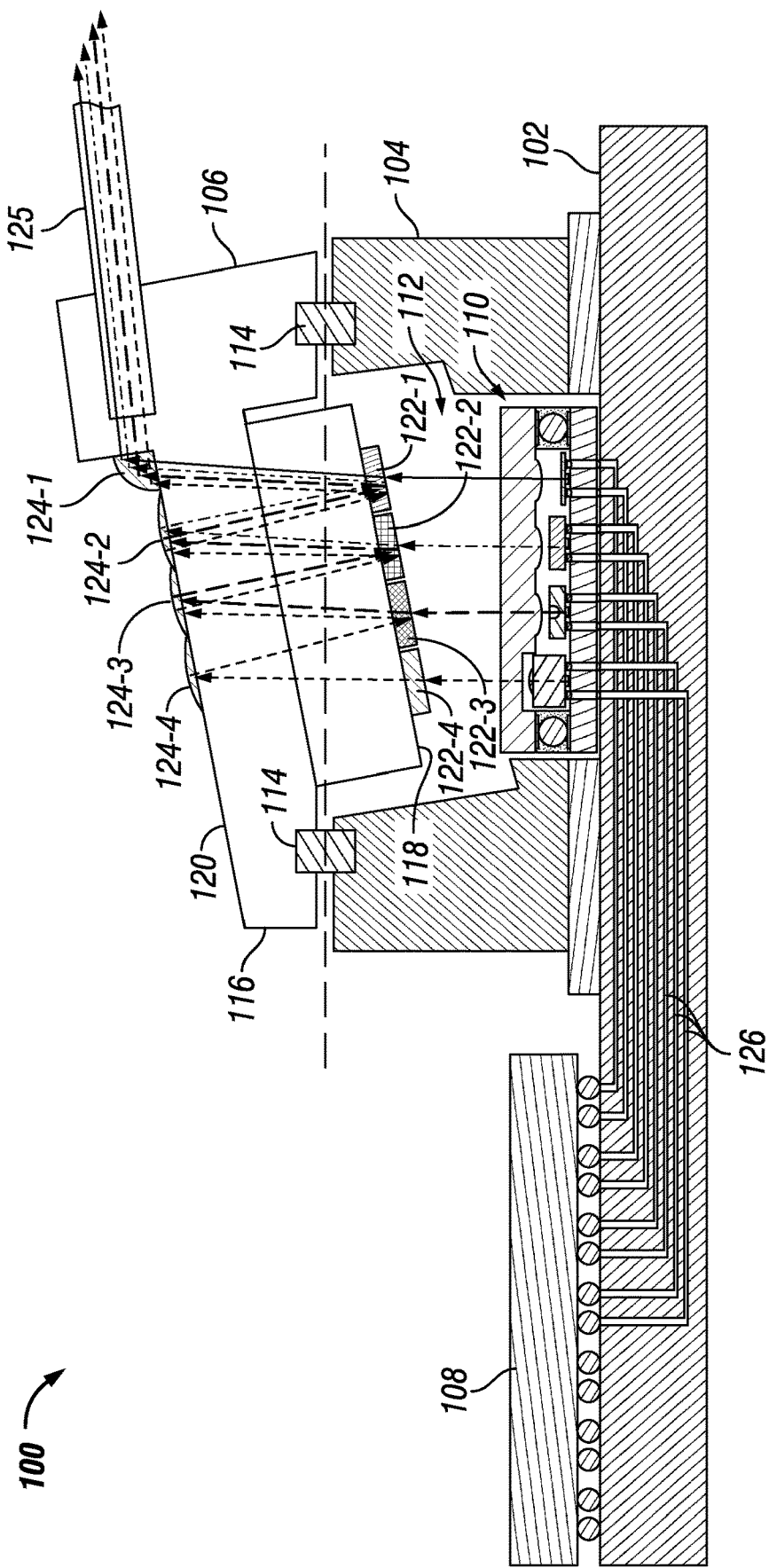
FIG. 1 illustrates a schematic cross-section view of an optical transceiver, according to one or more embodiments of the disclosure.

Illustrative embodiments of the subject matter claimed below will now be disclosed. In the interest of clarity, not all features of an actual implementation are described in this specification. It will be appreciated that in the development of any such actual embodiment, numerous implementation-specific decisions will be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Optical modules, such as optical transceivers, may utilize wavelength-division multiplexing (VVDM) to combine multiple optical signals having different wavelengths into a waveguide or optical fiber (i.e., multiplexing) or separate a received optical signal into constituent optical signals having different wavelengths (i.e., demultiplexing). WDM may be useful for data transmission in datacenter and networking applications.

To generate and transmit an optical signal, an optical transceiver may include a plurality of light sources, such as vertical-cavity surface-emitting lasers (VCSELs). The VCSELs may be fabricated on supporting substrates and operate at different wavelengths to emit optical signals of different wavelengths into a filter-based WDM optical connector for multiplexing. The WDM optical connector may also be used to receive an optical signal, specifically to demultiplex a multiplexed optical signal, and the demultiplexed optical signal may be detected by a plurality of photodetectors or other suitable devices and converted to an electrical signal for processing by a host device.

VCSELs may transmit optical signals at wavelengths including, for example, about 850 nm in some instances, and about 980 nm, about 1310 nm or about 1550 nm in other instances. The ability of an individual VCSEL to transmit certain wavelengths (e.g., about 850 nm) may be dependent on factors, such as, for example, the cavity resonance and the material of the substrate on which the VCSEL is fabricated. Generally, in the case of bottom-emitting VCSELs fabricated on a gallium arsenide substrate, optical signals having wavelengths of about 850 nm may be absorbed by the gallium arsenide substrate and thus are prohibited from passing therethrough and being transmitted to the communication network. Accordingly, bottom-emitting VCSELs fabricated on gallium arsenide substrates and in use in optical transceivers to date are generally configured to emit optical signals having wavelengths of about 980 nm or greater.

Embodiments of the present disclosure provide an optical apparatus for use in an optical transceiver coupled to a communication network, where the optical apparatus has a plurality of bottom-emitting VCSELs flip chipped to an interposer. At least one of the bottom-emitting VCSELs is configured to emit an optical signal having a wavelength of about 850 nm and is fabricated on a non-transparent substrate (e.g., gallium arsenide)—that is, a substrate that is opaque to the 850 nm wavelength. At least a portion of the non-transparent substrate is removed to allow the at least one bottom-emitting VCSEL to emit the optical signal having a wavelength of about 850 nm to the communication network coupled to the optical transceiver. Accordingly, the optical transceiver of the present disclosure may operate exclusively at wavelengths of about 850 nm, as is used in many datacenters, or may operate at multiple wavelengths, where at least one wavelength is about 850 nm and at least one other wavelength is about 980 nm, about 1310 nm, or about 1550 nm.

Particularly, in one embodiment of the present disclosure, an optical apparatus for an optical transceiver includes an interposer, a glass lens chip bonded to the interposer, and a plurality of bottom-emitting vertical-cavity surface-emitting lasers (VCSELs) flip chipped to the interposer and fabricated on respective substrates. At least one substrate includes a first portion opaque to a wavelength of an optical signal of a bottom-emitting VCSEL fabricated on the at least one substrate, and a second portion transparent to the wavelength of the optical signal of the bottom-emitting VCSEL fabricated on the at least one substrate after removal of the first portion from the at least one substrate.

In another embodiment of the present disclosure, an optical apparatus for an optical transceiver includes: a silicon interposer; a plurality of bottom-emitting vertical-cavity surface-emitting lasers (VCSELs); a glass lens chip; a plurality of mechanical standoffs; and underfill. The plurality of bottom-emitting VCSELs are flip chipped to the silicon interposer and fabricated on respective substrates, wherein at least one substrate includes a first portion opaque to a wavelength of an optical signal of a bottom-emitting VCSEL fabricated on the at least one substrate, and a second portion transparent to the wavelength of the optical signal of the bottom-emitting VCSEL fabricated on the at least one substrate after removal of the first portion from the at least one substrate. The glass lens chip is spaced from the silicon interposer and forms at least one lens to collimate the optical signal. The plurality of mechanical standoffs is disposed between the silicon interposer and the glass lens chip. The silicon interposer and the glass lens chip define a gap therebetween in which the plurality of bottom-emitting VCSELs are disposed. The underfill is disposed in at least a portion of the gap.

In another embodiment of the present disclosure, a method is provided for manufacturing an optical apparatus for an optical transceiver. The method includes fabricating a silicon interposer, and fabricating a plurality of bottom-emitting vertical-cavity surface-emitting lasers (VCSELs) on respective substrates. At least one of the bottom-emitting VCSELs is capable of emitting an optical signal having a wavelength of about 850 nm and is fabricated on a non-transparent substrate. The method also includes removing at least a portion of the non-transparent substrate on which the at least one bottom-emitting VCSEL is fabricated, and flip chipping the plurality of bottom-emitting VCSELs onto the silicon interposer. The method further includes fabricating at least one lens on a glass lens chip, and bonding the glass lens chip to the silicon interposer.

In the present disclosure, the terms "top" and "bottom" are employed for orientation purposes, to indicate the axial position of a layer or grouping of layers, relative to the active region. For example, the term "bottom" denotes a layer or grouping of layers that is (or will be) between the active region and the supporting substrate, and the term "top" denotes a layer or grouping of layers on the other side of the active region. In addition, the term "about" when applied to a value generally means within the tolerance range of the equipment used to produce the value, or in some examples, means plus or minus 10%, or plus or minus 5%, or plus or minus 1%, unless otherwise expressly specified.

Furthermore, the phrase "capable of" as used herein is a recognition of the fact that some functions described for the various parts of the disclosed optical apparatus are performed only when the optical apparatus is powered and/or in operation. Those in the art having the benefit of this disclosure will appreciate that the embodiments illustrated herein include a number of electronic or electro-mechanical parts that, to operate, require electrical power. Even when provided with power, some functions described herein only occur when in operation. Thus, at times, some embodiments of the optical apparatus of the present disclosure are "capable of" performing the recited functions even when they are not actually performing them—i.e., when there is no power or when they are powered but not in operation.

Turning now to the Figures, FIG. 1 illustrates a schematic cross-section view of an optical transceiver 100, according to one or more embodiments of the disclosure. The optical transceiver 100 is configured for use in transmitting and receiving optical signals in connection with an external host device (not shown) that is operatively connected in one embodiment to a communications network (also not shown). The optical transceiver 100 enables transmission and reception of optical signals containing data to and from the communications network.

To that end, the optical transceiver 100 may include a substrate 102, an optical socket 104, a wavelength-division multiplexing (WDM) optical connector 106, an application specific integrated circuit (ASIC) 108, and an optical apparatus 110. The substrate 102 may be an organic substrate for flip chip assembly. In one or more embodiments, the substrate 102 may be constructed from silicon; however, the present disclosure is not limited thereto, and other suitable substrates may be constructed from materials, such as, for example, glass and ceramic.

The optical socket 104 may be disposed on and mounted to the substrate 102 and configured to receive the WDM optical connector 106. In some embodiments, the optical socket 104 may form a frame or enclosure so as to define a chamber 112 in conjunction with the WDM optical connector 106. In one or more embodiments, the optical socket 104 may be a rectangular frame. FIG. 1 may be understood to show a cross-sectional side view of the optical socket 104 (and of the optical transceiver 100 generally) and thus depicts cross-sections of two sides of an example frame-shaped optical socket.

The WDM optical connector 106 may be detachably coupled to the optical socket 104 via mechanical fasteners 114 (two shown) or other mating features (e.g., bolts, latches, a hole and a pin, and the like). The WDM optical connector 106 may include an optical body 116 having an inner surface 118 and an outer surface 120. As illustrated in FIG. 1, a plurality of filters 122-1 through 122-4 (also referred to collectively as filters 122 or individually and generally as a filter 122) may be disposed on the inner surface 118 of the WDM optical connector 106. The filters 122 selectively allow passage of optical signals of certain wavelengths, and in some implementations, some of the filters 122 selectively allow optical signals of different wavelengths than others of the filters 122.

In one or more embodiments, the filters 122 may work in conjunction with other elements of the WDM optical connector 106. As illustrated in FIG. 1, the filters 122 may work in conjunction with reflective relay mirrors 124-1 through 124-4 (also referred to collectively as relay mirrors 124 or individually and generally as a relay mirror 124) disposed on or formed from the outer surface 120 of the optical body 116 to provide an optical zig-zag cavity for multiplexing or demultiplexing optical signals. In addition, at least one filter 122-1 may work in conjunction with the relay mirror 124-1 to turn or otherwise direct the multiplexed optical signal to a waveguide or optical fiber 125 coupled to the WDM optical connector 106 for the transmission of the multiplexed optical signal to the communication network.

The ASIC 108 may be disposed on the substrate 102, and in one or more embodiments, may be adjacent the optical socket 104. The ASIC 108 may be flip chipped to the substrate 102 and electrically coupled to an electrical interface 126 disposed in or formed by the substrate 102. The ASIC 108 may include electrical components configured to control the optical apparatus 110.

Figure 2:
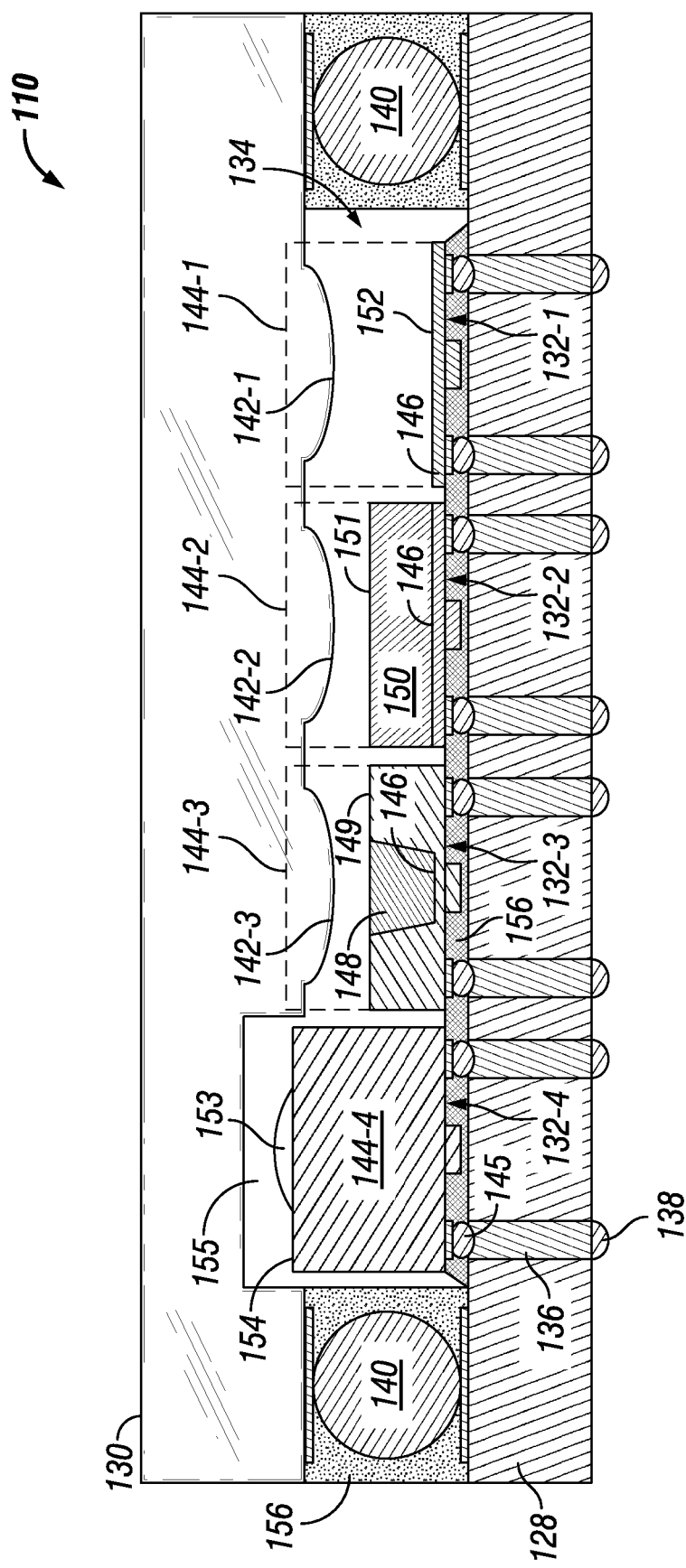
FIG. 2 illustrates an enlarged view of an example optical apparatus illustrated in FIG. 1, according to one or more embodiments of the disclosure.

Referring now to FIG. 2 with continued reference to FIG. 1, FIG. 2 illustrates an enlarged view of the optical apparatus 110 illustrated in FIG. 1, according to one or more embodiments of the disclosure. The optical apparatus 110 may be disposed on the substrate 102 within the chamber 112 defined by the optical socket 104 and the WDM optical connector 106. The optical apparatus 110 may be electrically coupled to the electrical interface 126 and thus communicatively coupled to the ASIC 108. The optical apparatus 110 may include an interposer 128, a glass lens chip 130, and a plurality of optoelectronic devices 132-1 through 132-4 (also referred to collectively as optoelectronic devices 132 or individually and generally as an optoelectronic device 132) disposed in a gap 134 defined by the interposer 128 and the glass lens chip 130. In one or more embodiments, the glass lens chip 130 may be coefficient of thermal expansion (CTE) matched to the interposer 128.

The interposer 128 may be constructed, for example, from silicon, glass, ceramic, glass ceramic, and flex. In one or more embodiments, the interposer 128 may be constructed from silicon. As illustrated in FIG. 1, the interposer 128 includes a plurality of electrical conduits 136 (only one indicated) arranged to electrically couple the electrical interface 126 and the plurality of optoelectronic devices 132. In one or more embodiments, the electrical conduits 136 may be disposed in a silicon-constructed interposer and may be referred to herein as through silicon vias (TSVs). The interposer 128 may further include a plurality of solder bumps 138 (only one indicated) disposed at the bottom end of each electrical conduit 136 and provided to electrically couple the electrical interface 126 and the plurality of optoelectronic devices 132.

The glass lens chip 130 may be bonded to the interposer 128 and spaced therefrom via a plurality of mechanical standoffs 140 (two shown) to define the gap 134 between the glass lens chip 130 and the interposer 128. The plurality of mechanical standoffs 140 may be or include solder bumps, copper pillars, glass spheres, silicon pillars, nickel pillars, photodefinable polymer (e.g., SU-8), or a combination thereof. The plurality of mechanical standoffs 140 are sized and configured such that the gap 134 provides clearance between each of the optoelectronic devices 132 and the glass lens chip 130.

The glass lens chip 130 may be aligned and bonded with the interposer 128 via solder reflow. In addition, the glass lens chip 130 may be aligned with the plurality of optoelectronic devices 132 via solder reflow. Photolithography may be utilized to pattern flip chip sites for the optoelectronic devices 132 in the interposer 128. Solder reflow may then self-align the interposer 128 and the glass lens chip 130, and the optoelectronic devices 132 and the glass lens chip 130. As aligned, the glass lens chip 130 may have or form one or more lenses 142-1 through 142-3 (also referred to collectively as lenses 142 or individually and generally as a lens 142). In some embodiments, the lenses 142-1 through 142-3 may be coaxially aligned with a respective optoelectronic device 132. In other embodiments, the optical axes of the lenses 142-1 through 142-3 are not aligned to the respective axes of the optoelectronic devices 132. In one or more embodiments, one or more of the lenses 142 may be a collimating lens.

The plurality of optoelectronic devices 132 may include a plurality of bottom-emitting VCSELs or a combination of bottom-emitting VCSELs and surface illuminated photodetectors (not shown). In embodiments including one or more surface illuminated photodetectors, each surface illuminated photodetector may be positioned to receive an optical signal through a respective lens 142 from a filter 122. Accordingly, an optical signal demultiplexed by the WDM optical connector 106 may be detected by surface illuminated photodetectors. The surface illuminated photodetectors may be a single chip or multiple chips with individual surface illuminated photodetectors or arrays of surface illuminated photodetectors.

As illustrated in FIGS. 1 and 2, the plurality of optoelectronic devices 132 is an array of bottom-emitting VCSELs fabricated on respective supporting substrates 144-1 through 144-4 (also referred to collectively as supporting substrates 144 or individually and generally as a supporting substrate 144) and configured to generate and transmit respective optical signals to the communication network. The array of bottom-emitting VCSELs may be fabricated as a one-dimensional array or a two-dimensional array of bottom-emitting VCSELs. Although four bottom-emitting VCSELs 132-1 through 132-4 are illustrated in FIGS. 1 and 2, it should be understood that more or fewer bottom-emitting VCSELs may be employed in a manner consistent with the present disclosure. It will be understood that the number of bottom-emitting VCSELs employed will dictate the number of filters 122 and relay mirrors 124 employed in the WDM optical connector 106.

Each of the bottom-emitting VCSELs 132 may be flip chipped to the interposer 128 via solder bumps 145 (only one indicated in FIG. 2) and communicatively coupled to the ASIC 108 via the electrical interface 126 formed in the substrate 102 and the electrical conduits 136 disposed in the interposer 128. Flip chipping the bottom-emitting VCSELs 132 to the interposer 128 may be advantageous in that the optical output of each bottom-emitting VCSEL 132 is on opposing sides of the supporting substrate 144 from the electrical inputs and outputs of the bottom-emitting VCSEL 132, which enables independent optimization of the electrical and optical I/O functionality and footprint.

In one or more embodiments, each of the bottom-emitting VCSELs 132 may be epitaxially grown as a layer structure on the respective supporting substrate 144. In particular the bottom-emitting VCSELs 132 may be epitaxially grown utilizing techniques such as, for example, molecular beam epitaxy (MBE), liquid phase epitaxy (LPE), a vapor phase epitaxy (VPE) process such as or metalorganic chemical vapor deposition (MOCVD, also known as MOVPE), or other known crystal growth processes. In other embodiments, one or more layers may be deposited with non-epitaxial deposition techniques such as e-beam evaporation, thermal evaporation, or sputtering.

Each of the bottom-emitting VCSELs 132 may include a top mirror (not shown) and a bottom mirror (not shown) defining a laser cavity (not shown). An active region (not shown) having one or more active layers may be disposed in the laser cavity between the top mirror and the bottom mirror. The bottom mirror may be an n-doped distributed Bragg reflector (nDBR) attached to and disposed on an adjacent surface of the supporting substrate, where the surface may be an etch stop layer 146. The top mirror may be a p-doped distributed Bragg reflector (pDBR) disposed over the active region. Each of the nDBR and the pDBR may be constructed from several layers of semiconductors of alternating high and low refractive index. The reflectivity of the pDBR and the nDBR may be in the range 99.5-99.9%. As a result, electrical energy pumped into the active region via a voltage source (not shown) may generate coherent light that oscillates or resonates perpendicular to the layers and escapes as an optical signal (e.g., laser beam) through the bottom of the bottom-emitting VCSEL 132.

The wavelength of the optical signal output by each bottom-emitting VCSEL 132 may be based, at least in part, on the laser cavity resonance of the respective bottom-emitting VCSEL 132. In the present disclosure, at least one bottom-emitting VCSEL 132 is configured to emit an optical signal having a wavelength of about 850 nm. In another embodiment, a plurality of bottom-emitting VCSELs 132 is configured to emit an optical signal having a wavelength of about 850 nm. In yet another embodiment, each of the bottom-emitting VCSELs 132 is configured to emit an optical signal having a wavelength of about 850 nm.

The present disclosure is not limited to bottom-emitting VCSELs 132 being configured to emit an optical signal having a wavelength of about 850 nm. For example, in one embodiment, at least one bottom-emitting VCSEL 132 is configured to emit an optical signal having a wavelength of about 850 nm, and at least one other bottom-emitting VCSEL 132 is configured to emit an optical signal having a wavelength of about 980 nm, about 1300 nm, or about 1550 nm. In another embodiment, at least one bottom-emitting VCSEL 132 is configured to emit an optical signal having a wavelength of about 850 nm, and a plurality of other bottom-emitting VCSELs 132 is configured to emit respective optical signals having wavelengths of about 980 nm, about 1300 nm, about 1550 nm, or a combination thereof. For example, the plurality of bottom-emitting VCSELs 132 may emit optical signals having respective wavelengths of about 850 nm, about 980 nm, about 1300 nm, and about 1550 nm.

The supporting substrates 144 on which the respective bottom-emitting VCSELs 132 are fabricated may be constructed of a semiconductor material. In one or more embodiments, at least one of the bottom-emitting VCSELs 132 may be fabricated on a supporting substrate 144 constructed from gallium arsenide. In another embodiment, the supporting substrate 144 may be constructed from indium phosphide or gallium nitride. As is known to those of ordinary skill in the art, substrates constructed of gallium arsenide and indium phosphide absorb optical signals having a wavelength of about 850 nm, but optical signals having a wavelength of at least about 980 nm are not absorbed and may pass through the substrates constructed of gallium arsenide, indium phosphide, or gallium nitride. Accordingly, the supporting substrates 144 in the present disclosure may be transparent (permit the passage of optical signals therethrough) or non-transparent (prevent optical signals from passing therethrough) based at least in part on the wavelength of the emitted optical signal.

Thus, as shown most clearly in FIG. 2 and as discussed in greater detail below, the non-transparent supporting substrates 144-1 through 144-3 corresponding to the bottom-emitting VCSELs 132-1 through 132-3 configured to emit an optical signal having a wavelength of about 850 nm are altered to allow the respective optical signals to pass through the bottom of the VCSELs 132-1 through 132-3 to the communication network. In the embodiment illustrated in FIGS. 1 and 2, the bottom-emitting VCSELs 132-1 through 132-3 emit a respective optical signal having a wavelength of about 850 nm and are fabricated on respective supporting substrates 144-1 through 144-3 constructed from gallium arsenide. Accordingly, each of the supporting substrates 144-1 through 144-3 are considered non-transparent in their non-altered states.

In one or more embodiments, the supporting substrate 144-3 on which the bottom-emitting VCSEL 132-3 is fabricated may be altered as shown most clearly in FIG. 2. A surface of the supporting substrate 144-3 opposing the bottom-emitting VCSEL 132-3 may be ground and polished to reduce the aspect ratio of the bottom-emitting VCSEL 132-3 including the supporting substrate 144-3. Additionally, a central aperture 148 may be formed via etching or a like process through the supporting substrate 144-3 and terminating at the etch stop layer 146 adjacent the nDBR. In one or more embodiments, the central aperture 148 may be coated with an anti-reflection coating or substantially filled and sealed with an optically transparent material subsequently coated with an anti-reflection layer or layers. Accordingly, the supporting substrate 144-3 may be reduced to a thickness of less than about 250 microns. In one or more embodiments, an anti-reflection coating 149 is applied to the polished surface of the supporting substrate 144-3. After removal of the portion of the supporting substrate 144-3 (shown in phantom) via the creation of the central aperture 148 and grinding of the surface of the supporting substrate 144-3 opposing the bottom-emitting VCSEL 132-3, the optical signal having a wavelength of about 850 nm may be emitted from the bottom-emitting VCSEL 132-3 and transmitted to the glass lens chip 130.

In one or more embodiments, the supporting substrate 144-2 on which the bottom-emitting VCSEL 132-2 is fabricated may be altered as shown in FIGS. 1 and 2. All or substantially all (e.g., greater than about 75% thereof) of the supporting substrate 144-2 on which the bottom-emitting VCSEL 132-2 was fabricated may be removed via etching ora like process, which may be terminated at the etch stop layer 146 adjacent the nDBR. A transparent substrate 150 having a thickness of less than about 200 microns and being CTE matched to the bottom-emitting VCSEL 132-2 and coated with an anti-reflection coating 151 may be bonded to the bottom-emitting VCSEL 132-2 to increase the mechanical robustness of the bottom-emitting VCSEL 132-2.

The transparent substrate 150 may be CTE matched to the bottom-emitting VCSEL 132-2 to mitigate thermally induced stress in the bottom-emitting VCSEL 132-2. In one or more embodiments, the transparent substrate 150 may be constructed, for example, from glass, sapphire, or gallium nitride. After removal of all or substantially all of the supporting substrate 144-2 (shown in phantom) and bonding the transparent substrate 150 to the VCSEL 132-2, the optical signal having a wavelength of about 850 nm may be emitted from the bottom-emitting VCSEL 132-2 and transmitted to the glass lens chip 130.

In one or more embodiments, the supporting substrate 144-1 on which the bottom-emitting VCSEL 132-1 is fabricated may be altered as shown in FIGS. 1 and 2. All or substantially all (e.g., greater than about 75% thereof) of the supporting substrate 144-1 on which the bottom-emitting VCSEL 132-1 was fabricated may be removed via etching or a like process, which may be terminated at the etch stop layer 146 adjacent the nDBR. In one or more embodiments, an anti-reflection coating 152 is applied to the surface of the supporting substrate 144-1 opposing the bottom-emitting VCSEL 132-1. After removal of all or substantially all of the supporting substrate 144-1 (shown in phantom) via the etching or like process, the optical signal having a wavelength of about 850 nm may be emitted from the bottom-emitting VCSEL 132-1 and transmitted to the glass lens chip 130. In other embodiments, the bottom-emitting VCSEL 132-1 may be coated with a stress compensating film or films.

In the embodiment illustrated in FIGS. 1 and 2, the bottom-emitting VCSEL 132-4 emits an optical signal having a wavelength of at least about 980 nm and is fabricated on a supporting substrate 144-4 constructed from gallium arsenide. Accordingly, the supporting substrate 144-4 may be considered transparent at this wavelength. The aspect ratio of the bottom-emitting VCSEL 132-4 including the supporting substrate 144-4 may be considered a high-aspect ratio with reference to the other bottom-emitting VCSELs 132-1 through 132-3. The surface of the supporting substrate 144-4 opposing the bottom-emitting VCSEL 132-4 may further form an integrated lens 153 through which the optical signal may pass. In one or more embodiments, an anti-reflection coating 154 is applied to the surface of the supporting substrate 144-4 opposing the bottom-emitting VCSEL 132-4.

As shown in FIG. 1 and more clearly in FIG. 2, the glass lens chip 130 has a thickness (e.g., about 200 microns or greater) and forms the lenses 142-1 through 142-3. In some embodiments, each of the bottom-emitting VCSELs 132-1 through 132-3 is coaxially aligned with a respective lens 142-1 through 142-3 formed in the glass lens chip 130. As disclosed above, the remaining bottom-emitting VCSEL 132-4 has the integrated lens 153 and thus, a corresponding lens in the glass lens chip 130 is omitted. In place of the omitted lens is a cavity 155 defined by the glass lens chip 130. The cavity 155 is sized to allow for the thickness of the high aspect ratio bottom-emitting VCSEL 132-4 relative to the other bottom-emitting VCSELs 132.

The lenses 142-1 through 142-3 formed in the glass lens chip in FIGS. 1 and 2 are positioned facing the bottom-emitting VCSELs 132-1 through 132-3 and are convex in form. The lenses 142-1 through 142-3 are collimating lenses to collimate the optical signal so that the diameter of the respective lenses 142 exceeds the diameter of the optical signal exiting the bottom-emitting VCSELs 132-1 through 132-3. As the lenses 142-1 through 142-3 are positioned facing the bottom-emitting VCSELs 132-1 through 132-3, underfill 156 may be placed about the perimeter of the optical apparatus 110 and between each bottom-emitting VCSEL 132 and the interposer 128. The underfill 156 may be a thermally conductive underfill provided to minimize the thermal resistance to the interposer 128, which acts as a heat spreader to facilitate efficient heat transfer from the bottom-emitting VCSELs 132 to the substrate 102 and/or an external heat sink (not shown).

Figure 3:
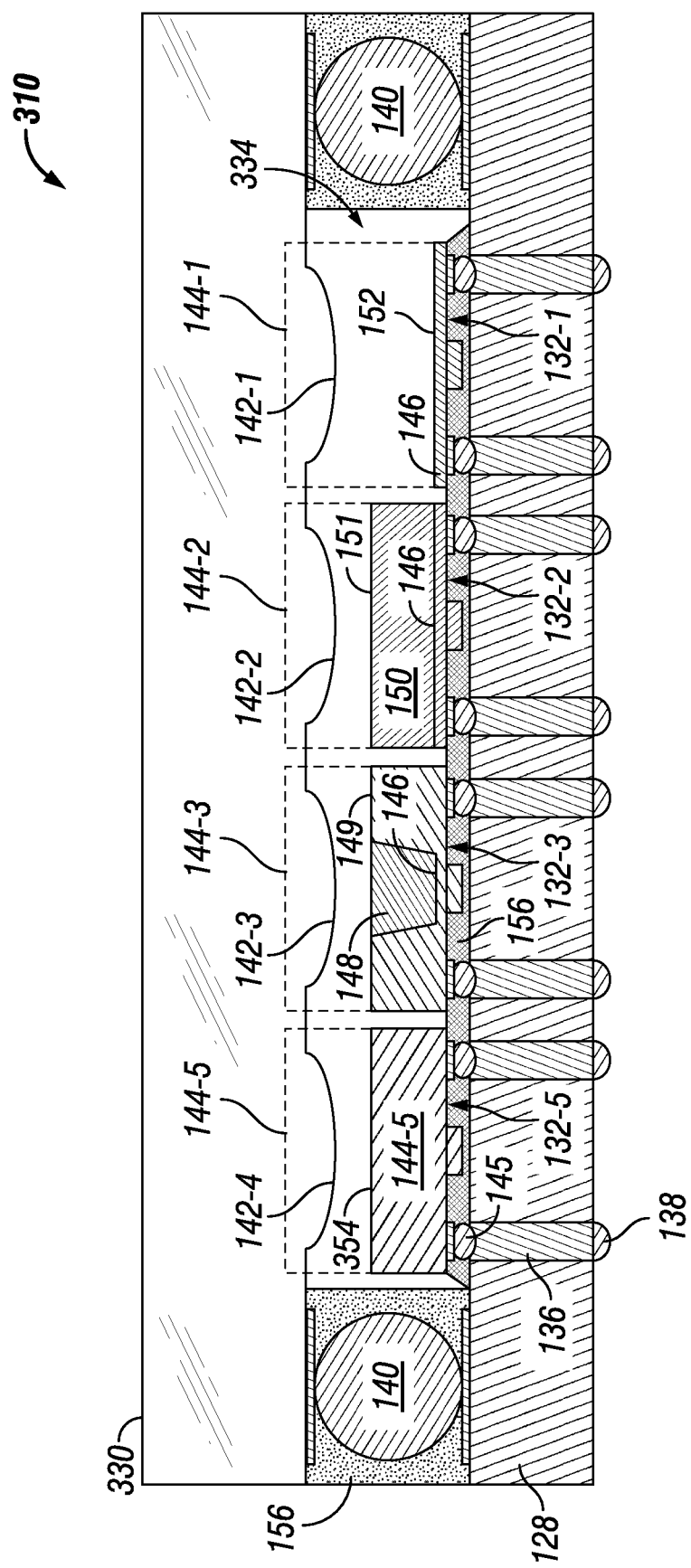
FIG. 3 illustrates a schematic cross-section view of another example optical apparatus that may be suitable for use in the optical transceiver of FIG. 1, according to one or more embodiments of the disclosure.

Referring now to FIG. 3 with continued reference to FIG. 1, FIG. 3 illustrates a schematic cross-section view of another example optical apparatus 310 that may be suitable for use in the optical transceiver 100 of FIG. 1, according to one or more embodiments of the disclosure. The optical apparatus 310 shown in FIG. 3 is similar to the optical apparatus 110 shown in FIGS. 1 and 2, and like reference numerals are used to indicate like parts. In the embodiment illustrated in FIG. 3, a bottom-emitting VCSEL 132-5 emits an optical signal having a wavelength of about 980 nm and is fabricated on a supporting substrate 144-5 constructed from gallium arsenide. In another embodiment, the bottom-emitting VCSEL 132-5 may emit an optical signal having a wavelength of about 1300 nm or about 1550 nm and is fabricated on a supporting substrate 144-5 constructed from indium phosphide. Accordingly, the supporting substrate 144-5 may be considered transparent at these wavelengths in either of these embodiments. The surface of the supporting substrate 144-5 opposing the bottom-emitting VCSEL 132-5 may be ground and polished to reduce the aspect ratio of the bottom-emitting VCSEL 132-5 including the supporting substrate 144-5. Accordingly, the supporting substrate 144-5 may be reduced to a thickness of less than 250 microns via the removal of a portion of the supporting substrate 144-5 (shown in phantom) and may have a mirror finish. In one or more embodiments, an anti-reflection coating 354 is applied to the polished surface of the supporting substrate 144-5.

As illustrated in FIG. 3, the optical apparatus 310 includes a glass lens chip 330 that has a thickness (e.g., about 200 microns or greater), and in addition to the lenses 142-1 through 142-3, includes a lens 142-4. In some embodiments, the lens 142-4 is coaxially aligned with the bottom-emitting VCSEL 132-5. In other embodiments, the optical axis of the lenses 142-4 is not aligned to the optical axis of the bottom-emitting VCSEL 132-5. The lens 142-4 is positioned facing the bottom-emitting VCSEL 132-5 and is convex in form. The lens 142-4 is a collimating lens to collimate the optical signal so that the diameter of the lens 142-4 exceeds the diameter of the optical signal exiting the bottom-emitting VCSEL 132-5. Consistent with the optical apparatus 110 of FIGS. 1 and 2, underfill 156 may be placed about the perimeter of the optical apparatus 310 and between each bottom-emitting VCSEL 132-1 through 132-3 and 132-5 and the interposer 128 in a gap 334 defined by the interposer 128 and the glass lens chip 330.

Figure 4:
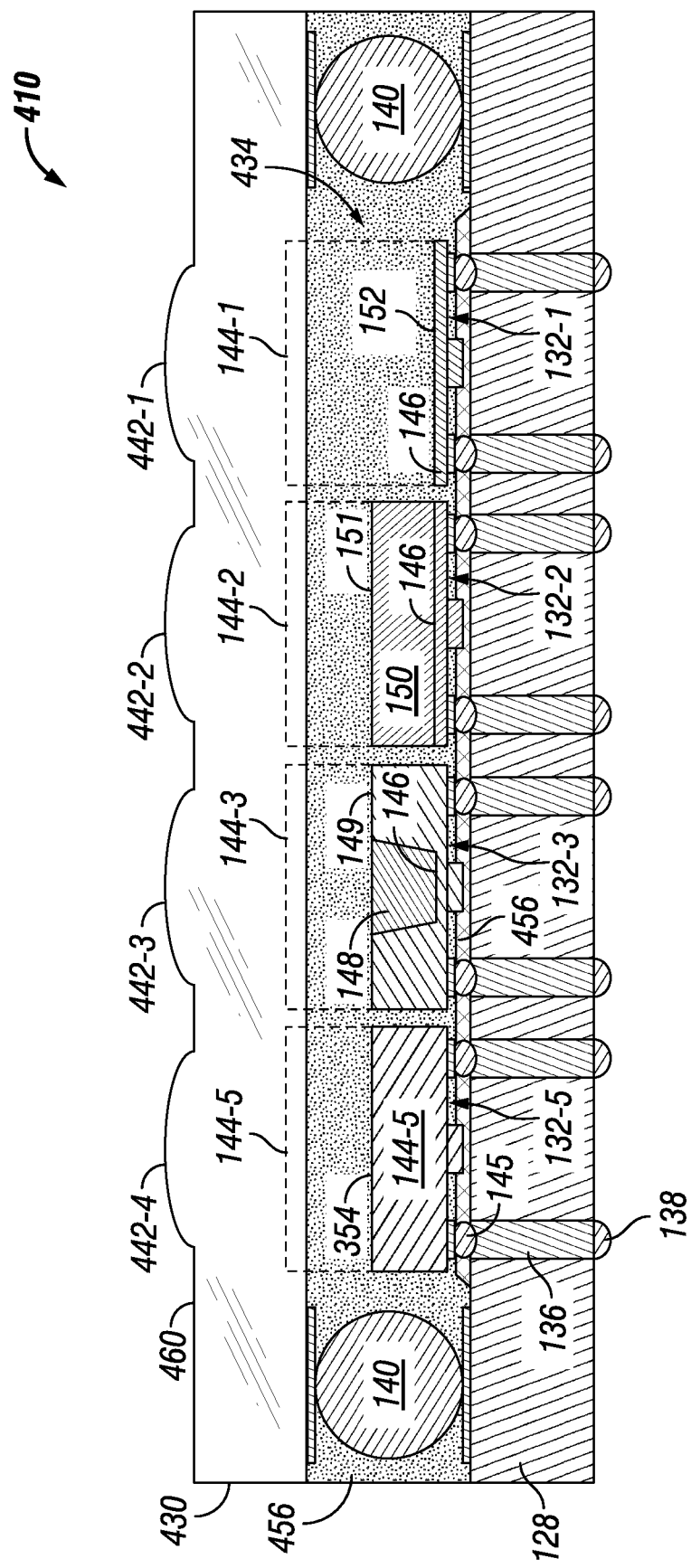
FIG. 4 illustrates a schematic cross-section view of another example optical apparatus that may be suitable for use in the optical transceiver of FIG. 1, according to one or more embodiments of the disclosure.

Referring now to FIG. 4 with continued reference to FIG. 1, FIG. 4 illustrates a schematic cross-section view of another example optical apparatus 410 that may be suitable for use in the optical transceiver 100 of FIG. 1, according to one or more embodiments of the disclosure. The optical apparatus 410 shown in FIG. 4 is similar to the optical apparatus 110 shown in FIG. 3, and like reference numerals are used to indicate like parts. In the embodiment illustrated in FIG. 4, the optical apparatus 410 includes a glass lens chip 430 that has a thickness (e.g., less than about 500 microns) and may form a plurality of lenses 442-1 through 442-4 (also referred to collectively as lenses 442 or individually and generally as a lens 442). In some embodiments, the lenses 442-1 through 442-4 are coaxially aligned with the respective bottom-emitting VCSELs 132-1 through 132-3 and 132-5. In other embodiments, the optical axes of the lenses 442-1 through 442-4 are not aligned to the respective axes of the bottom-emitting VCSELs 132-1 through 132-3 and 132-5.

The lenses 442 formed in the glass lens chip 430 in FIG. 4 are positioned on an outer surface 460 of the glass lens chip 430 and are facing away from bottom-emitting VCSELs 132-1 through 132-3 and 132-5. The lenses 442 are convex in form. The lenses 442 are collimating lenses to collimate the optical signal so that the diameter of the lenses 442 exceeds the diameter of the optical signals exiting the respective bottom-emitting VCSELs 132-1 through 132-3 and 132-5. As the lenses 442 are positioned facing away from the bottom-emitting VCSELs 132-1 through 132-3 and 132-5, optical underfill 456 may be placed in a gap 434 defined between the interposer 128 and the glass lens chip 430. The optical underfill 456 may substantially fill the gap 434 (e.g., filling greater than about 75% of the gap 434) defined between the interposer 128 and the glass lens chip 430. Because the optical underfill 456 substantially fills the gap 434, anti-reflection coating may be omitted from the glass lens chip 430 and at least one bottom-emitting VCSEL 132, thus reducing manufacturing costs. Additionally, the addition of the optical underfill 456 substantially filling the gap 434 increases the mechanical robustness of the optical apparatus 410 and substantially seals the active regions of the bottom-emitting VCSELs 132-1 through 132-3 and 132-5 to protect the bottom-emitting VCSELs 132 from the environment, including moisture, dust, and other contaminants.

In the embodiments illustrated in FIGS. 1-4, the optical apparatus 110, 310, and 410 are depicted with the bottom-emitting VCSELs 132 arranged in a particular order. It will be understood by those of skill in the art that the present disclosure is not limited thereto, and the bottom-emitting VCSELs 132 may be arranged in any preferred order. Moreover, the optical apparatus 110, 310, and 410 of the present disclosure are not limited to the combination of bottom-emitting VCSELs 132 depicted. For example, any of the optical apparatus 110, 310, and 410 of the present disclosure may have none, one, or a plurality of any one of the bottom-emitting VCSELs 132. Thus, by way of example, in one embodiment, one of the optical apparatus 110, 310, and 410 may include only bottom-emitting VCSELs 132-2.

In another embodiment, an optical apparatus 110, 310, and 410 may include a plurality of bottom-emitting VCSELs 132-2 and a plurality of bottom-emitting VCSELs 132-3.

Referring back now to FIGS. 1 and 2, the optical transceiver 100 will be discussed with reference to optical apparatus 110; however, it will be understood that the following disclosure is not limited thereto, and either of optical apparatus 310 or optical apparatus 410 may be utilized in place of the optical apparatus 110 in some embodiments. Each lens 142 of the plurality of lenses 142-1 through 142-3 (and the integrated lens of the bottom-emitting VCSEL 153) is paired to a respective filter 122 of the WDM optical connector 106 when the WDM optical connector 106 is mated to the optical socket 104. Such pairing is depicted by the dot-dash lines between lenses 153 and 142-1 through 142-3 and filters 122-1 through 122-4, respectively. In some implementations, the optical axes of the lenses 153 and 142 are aligned to the center line of the filters 122. In other implementations, the optical axes of the lenses 153 and 142 are not aligned to the center line of the filters 122.

In some implementations, each bottom-emitting VCSEL 132 may be aimed through a respective lens 142, 153 (which may be, for example, a collimating lens) and at a filter 122 having a wavelength characteristic associated with that bottom-emitting VCSEL 132. Thus, the optical signal emitted by a plurality of bottom-emitting VCSELs 132 may be multiplexed by the WDM optical connector 106. The bottom-emitting VCSELs 132 may be fabricated with one-dimensional or two-dimensional arrays of bottom-emitting VCSELs 132.

When the WDM optical connector 106 is mated to the optical socket 104 as shown, the optical signal emitted from each bottom-emitting VCSELs 132 may be aimed via a respective lens 142 and 153 at a filter 122 of the WDM optical connector 106 having a wavelength characteristic associated with that bottom-emitting VCSELs 132. For example, an optical signal emitted by bottom-emitting VCSEL 132-1 at a first wavelength may be represented by a solid line passing through filter 122-1, an optical signal emitted by bottom-emitting VCSEL 132-2 at a second wavelength may be represented by a dot-dash line passing through filter 122-2, an optical signal emitted by bottom-emitting VCSEL 132-3 at a third wavelength may be represented by a long-dashed line passing through filter 122-3, and an optical signal emitted by bottom-emitting VCSEL 132-4 at a fourth wavelength may be represented by a short-dashed line passing through filter 122-4.

The filters 122 correspond to the wavelengths of the multiplexed optical signals and may allow optical signals having those wavelengths to enter or leave the optical body 116 but may reflect light of other wavelengths. Internally within the optical body 116, the optical signals may be reflected between the filters 122 and reflective relay mirrors 124. In particular, the filters 122 and reflective relay mirrors 124 may be offset so as to form a mode-matched optical zig-zag cavity. The WDM optical connector 106, and the filters 122 and the optical zig-zag cavity in particular, then multiplex spatially separated optical signals of different wavelengths from the VCSELs 132 into a single beam directed via the relay mirror 124-1 and coupled into the waveguide 125, such as an optical fiber.

Figure 5:
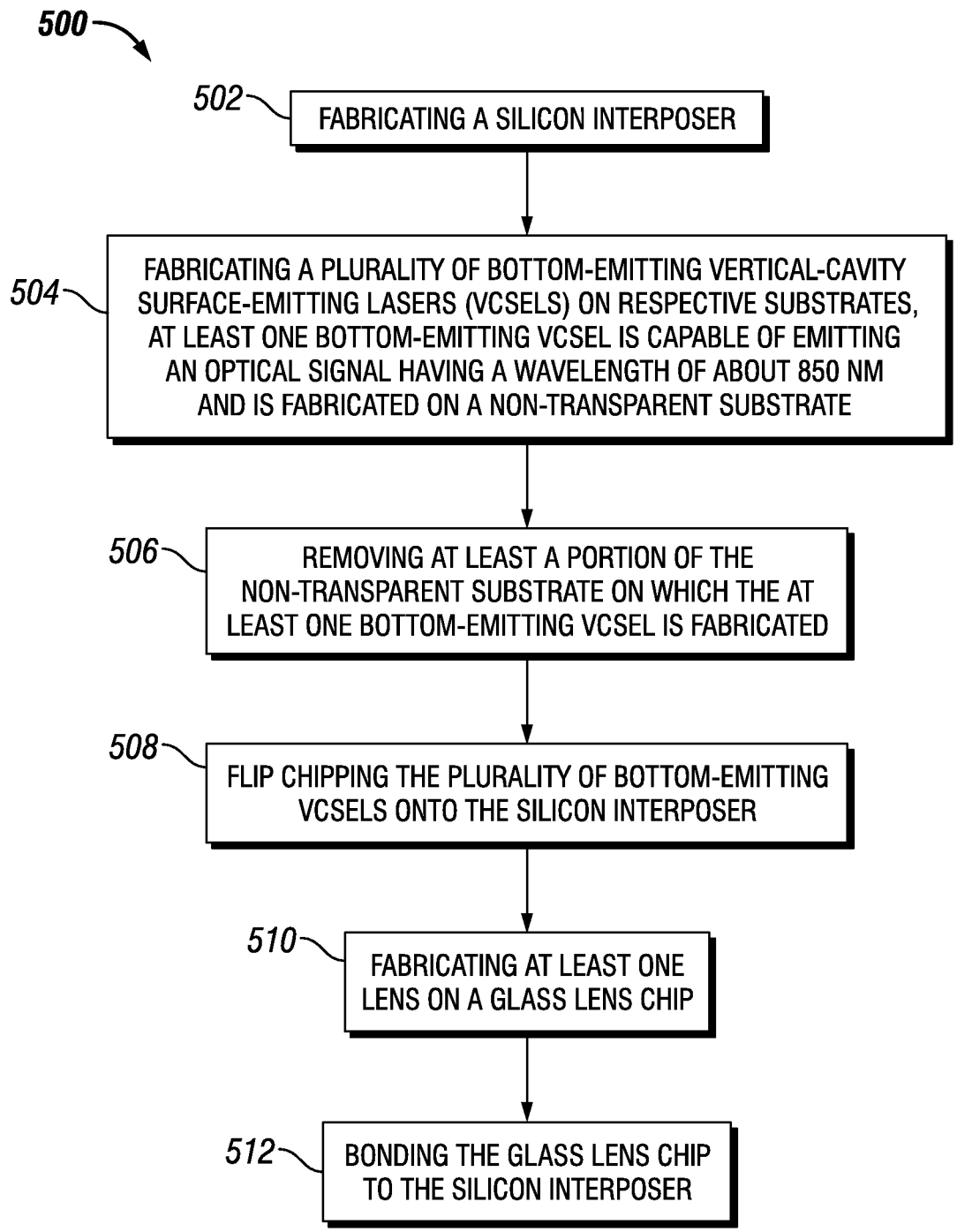
FIG. 5 is a flowchart depicting a method for manufacturing an optical apparatus for an optical transceiver, according to one or more embodiments of the disclosure.

Turning now to FIG. 5, FIG. 5 is a flowchart depicting a method 500 for manufacturing an optical apparatus for an optical transceiver, according to one or more embodiments of the disclosure. The method 500 may include fabricating a silicon interposer (block 502), and fabricating a plurality of bottom-emitting vertical-cavity surface-emitting lasers (VCSELs) on respective substrates (block 504). At least one bottom-emitting VCSEL is capable of emitting an optical signal having a wavelength of about 850 nm and is fabricated on a non-transparent substrate. The method 500 may also include removing at least a portion of the non-transparent substrate on which the at least one bottom-emitting VCSEL is fabricated (block 506), and flip chipping the plurality of bottom-emitting VCSELs onto the silicon interposer (block 508). The method 500 may further include fabricating at least one lens on a glass lens chip (block 510), and bonding the glass lens chip to the silicon interposer (block 512).

In one or more embodiments, bonding the glass lens chip to the silicon interposer may include adding an underfill about a perimeter of the optical apparatus. In one or more embodiments, bonding the glass lens chip to the silicon interposer may include adding an optical underfill to substantially fill a gap defined by the glass lens chip and the silicon interposer. In one or more embodiments, the method 500 may include conducting a wafer level test of at least one of the glass lens chip, the bottom-emitting VCSELs, and the silicon interposer. In one or more embodiments, the method 500 may include dicing at least one of the glass lens chip, the bottom-emitting VCSELs, and the silicon interposer after conducting the wafer level test thereof.

The foregoing description, for purposes of explanation, used specific nomenclature to provide a thorough understanding of the disclosure. However, it will be apparent to one skilled in the art that the specific details are not required in order to practice the systems and methods described herein. The foregoing descriptions of specific examples are presented for purposes of illustration and description. They are not intended to be exhaustive of or to limit this disclosure to the precise forms described. Obviously, many modifications and variations are possible in view of the above teachings. The examples are shown and described in order to best explain the principles of this disclosure and practical applications, to thereby enable others skilled in the art to best utilize this disclosure and various examples with various modifications as are suited to the particular use contemplated. It is intended that the scope of this disclosure be defined by the claims and their equivalents below.

What is claimed is:

1. An optical apparatus for an optical transceiver, comprising:
   an interposer;
   a glass lens chip bonded to the interposer;
   a plurality of bottom-emitting vertical-cavity surface-emitting lasers (VCSELs) flip chipped to the interposer and fabricated on respective substrates, wherein at least one substrate includes a first portion opaque to a wavelength of an optical signal of a bottom-emitting VCSEL fabricated on the at least one substrate, and a second portion transparent to the wavelength of the optical signal of the bottom-emitting VCSEL fabricated on the at least one substrate after removal of the first portion from the at least one substrate, the second portion fabricated as a continuous layer bonded to the bottom-emitting VCSEL, the second portion having upper and lower surfaces extending parallel to each other; and
   an etch stop layer disposed between the second portion and a n-doped distributed Bragg reflector.

2. The optical apparatus of claim 1, wherein the wavelength of the optical signal is about 850 nm.

3. The optical apparatus of claim 1, wherein the at least one substrate is constructed from gallium arsenide, indium phosphide, or gallium nitride.

4. The optical apparatus of claim 1, wherein the bottom-emitting VCSELs are epitaxially grown on the respective substrates.

5. The optical apparatus of claim 1, wherein the interposer is a silicon interposer.

6. The optical apparatus of claim 1, wherein the second portion of the at least one substrate defines a central aperture extending vertically therethrough, the central aperture formed from the removal of the first portion of the at least one substrate.

7. The optical apparatus of claim 1, wherein a transparent substrate is bonded to the second portion of the at least one substrate after removal of the first portion of the at least one substrate.

8. The optical apparatus of claim 1, wherein the glass lens chip forms at least one lens.

9. The optical apparatus of claim 8, further comprising:
a plurality of mechanical standoffs spacing the glass lens chip from the interposer; and
underfill disposed between the interposer and the glass lens chip and bonding the glass lens chip to the interposer.

10. An optical apparatus for an optical transceiver, comprising:
a silicon interposer;
a plurality of bottom-emitting vertical-cavity surface-emitting lasers (VCSELs) flip chipped to the silicon interposer and fabricated on respective substrates, wherein at least one substrate includes a first portion opaque to a wavelength of an optical signal of a first bottom-emitting VCSEL fabricated on the at least one substrate, and a second portion transparent to the wavelength of the optical signal of the first bottom-emitting VCSEL fabricated on the at least one substrate after removal of the first portion from the at least one substrate, the second portion having upper and lower surfaces extending parallel to each other, and wherein at least one second substrate of a second bottom-emitting VCSEL includes a first portion opaque to the wavelength of the optical signal of the first bottom-emitting VCSEL and is not removed from the at least one second substrate;
an etch stop layer disposed between the second portion and a n-doped distributed Bragg reflector;
a glass lens chip spaced from the silicon interposer and forming at least one lens to collimate the optical signal;
a plurality of mechanical standoffs disposed between the silicon interposer and the glass lens chip, the silicon interposer and the glass lens chip defining a gap therebetween in which the plurality of bottom-emitting VCSELs are disposed; and
underfill disposed in at least a portion of the gap.

11. The optical apparatus of claim 10, wherein the second portion of the at least one substrate defines a central aperture extending vertically therethrough, the central aperture formed from a removal of the first portion of the at least one substrate.

12. The optical apparatus of claim 10, wherein a transparent substrate is bonded to the second portion of the at least one substrate after removal of the first portion of the at least one substrate.

13. The optical apparatus of claim 12, further comprising an anti-reflection coating applied to a surface of the transparent substrate, the surface being adjacent the glass lens chip.

14. The optical apparatus of claim 10, further comprising an anti-reflection coating applied to a surface of the second portion of the at least one substrate, the surface being adjacent the glass lens chip.

15. The optical apparatus of claim 10, wherein the wavelength of the optical signal is about 850 nm.

* * * * *